United States Patent
Gates et al.

(10) Patent No.: US 7,288,292 B2
(45) Date of Patent: Oct. 30, 2007

(54) ULTRA LOW K (ULK) SICOH FILM AND METHOD

(75) Inventors: Stephen McConnell Gates, Ossining, NY (US); Alfred Grill, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/390,801

(22) Filed: Mar. 18, 2003

(65) Prior Publication Data

US 2005/0276930 A1 Dec. 15, 2005

(51) Int. Cl.
- H05H 1/24 (2006.01)
- H05H 1/46 (2006.01)
- C23C 16/50 (2006.01)
- C23C 16/40 (2006.01)
- C23C 16/56 (2006.01)
- B05D 3/06 (2006.01)

(52) U.S. Cl. ............... 427/489; 438/789; 438/786; 427/579; 427/503; 427/563; 427/551

(58) Field of Classification Search ............... 427/503, 427/489, 551, 552, 563, 579, 387; 438/786, 438/789; 428/447
See application file for complete search history.

(56) References Cited

U.S. PATENT DOCUMENTS

| | | | |
|---|---|---|---|
| 6,147,009 A | 11/2000 | Grill et al. | |
| 6,270,846 B1 | 8/2001 | Brinker et al. | |
| 6,312,793 B1 * | 11/2001 | Grill et al. | 428/312.6 |
| 6,361,837 B2 * | 3/2002 | Pangrle et al. | 427/552 |
| 6,437,443 B1 | 8/2002 | Grill et al. | |

(Continued)

FOREIGN PATENT DOCUMENTS

| | | |
|---|---|---|
| EP | 1142832 | 10/2001 |
| WO | WO 02/07191 A2 | 1/2002 |

OTHER PUBLICATIONS

Jeffrey A. Lee, et al. "Characterization and integration of a CVD Porous Low-k (Trikon Orion) Dielectric" pp. 1-4; and, no date or source.

(Continued)

*Primary Examiner*—Marianne Padgett
(74) *Attorney, Agent, or Firm*—Scully, Scott, Murphy & Presser, P.C.; Robert M. Trepp, Esq.

(57) ABSTRACT

The present invention provides a multiphase, ultra low k film which exhibits improved elastic modulus and hardness as well as various methods for forming the same. The multiphase, ultra low k dielectric film includes atoms of Si, C, O and H, has a dielectric constant of about 2.4 or less, nanosized pores or voids, an elastic modulus of about 5 or greater and a hardness of about 0.7 or greater. A preferred multiphase, ultra low k dielectric film includes atoms of Si, C, O and H, has a dielectric constant of about 2.2 or less, nanosized pores or voids, an elastic modulus of about 3 or greater and a hardness of about 0.3 or greater. The multiphase, ultra low k film is prepared by plasma enhanced chemical vapor deposition in which one of the following alternatives is utilized: at least one precursor gas comprising siloxane molecules containing at least three Si—O bonds; or at least one precursor gas comprising molecules containing reactive groups that are sensitive to e-beam radiation. Electronic structures including the multiphase, ultra low k film are also disclosed.

20 Claims, 3 Drawing Sheets

U.S. PATENT DOCUMENTS

| | | |
|---|---|---|
| 6,441,491 B1 | 8/2002 | Grill et al. |
| 6,479,110 B2 * | 11/2002 | Grill et al. ............... 427/577 |
| 6,497,963 B1 | 12/2002 | Grill et al. |
| 6,541,398 B2 * | 4/2003 | Grill et al. ............... 438/780 |
| 6,582,777 B1 * | 6/2003 | Ross et al. ............... 427/551 |
| 6,756,323 B2 * | 6/2004 | Grill et al. ............... 438/780 |
| 6,770,573 B2 * | 8/2004 | Grill et al. ............... 438/778 |
| 6,790,789 B2 * | 9/2004 | Grill et al. ............... 438/778 |
| 6,846,515 B2 * | 1/2005 | Vrtis et al. ............ 427/255.29 |
| 6,936,551 B2 * | 8/2005 | Moghadam et al. ........ 438/780 |
| 7,098,149 B2 * | 8/2006 | Lukas et al. ............... 438/778 |
| 7,112,615 B2 * | 9/2006 | Gleason et al. ............... 521/77 |
| 2002/0060364 A1 | 5/2002 | Yan et al. |
| 2002/0076944 A1 | 6/2002 | Wang et al. |
| 2002/0117754 A1 | 8/2002 | Gates et al. |
| 2002/0127416 A1 * | 9/2002 | Hacker ............... 428/447 |
| 2002/0132408 A1 | 9/2002 | Ma et al. |
| 2002/0132496 A1 | 9/2002 | Ball et al. |
| 2002/0134995 A1 | 9/2002 | Yan et al. |
| 2002/0142579 A1 * | 10/2002 | Vincent et al. ............... 438/623 |
| 2003/0232495 A1 * | 12/2003 | Moghadam et al. ........ 438/623 |
| 2004/0096672 A1 * | 5/2004 | Lukas et al. ............... 427/551 |
| 2004/0101633 A1 * | 5/2004 | Zheng et al. ............... 427/551 |
| 2004/0175581 A1 * | 9/2004 | Nguyen et al. ............ 428/447 |
| 2004/0197474 A1 * | 10/2004 | Vrtis et al. ............ 427/255.28 |
| 2004/0241463 A1 * | 12/2004 | Vincent et al. ............ 428/447 |
| 2005/0161060 A1 * | 7/2005 | Johnson et al. ............... 134/1.1 |
| 2006/0006140 A1 * | 1/2006 | Lakshmanan et al. ........ 216/67 |
| 2006/0040110 A1 * | 2/2006 | Kohmura et al. ........... 428/446 |
| 2006/0078676 A1 * | 4/2006 | Lukas et al. ............. 427/248.1 |
| 2007/0009673 A1 * | 1/2007 | Fukazawa et al. .......... 427/569 |
| 2007/0093078 A1 * | 4/2007 | Harada et al. ............... 438/790 |

OTHER PUBLICATIONS

K. Buchanan, et al. "Characterisation and Integration of CVD Ultra Low k Films (k<2.2) for dual damascene IMD Applications", pp. 1-6; and, no date or source.

News Release, "Shipley Launches Low -K Dielectric Insulating Products for Newest Generations of Semiconductor Chips", May 29, 2001, pp. 1-2. on internet http:www.rohmhass.com Company.

Nigel P. Hacker, et al. (1997) "Properties of New Low Dielectric Constant Spin-On Silicon Oxide Based Polymers", Materials Research Society, vol. 476, pp. 25-29, Apr. 1997.

* cited by examiner

US 7,288,292 B2

ULTRA LOW K (ULK) SICOH FILM AND METHOD

RELATED APPLICATIONS

This application is related to co-assigned U.S. Pat. Nos. 6,312,793, 6,441,491 and 6,479,110 B2, the disclosures of which are incorporated herein by reference.

FIELD OF THE INVENTION

The present invention generally relates to ultra low dielectric constant (k) films, methods of fabricating such films and to electronic devices containing such films. More particularly, the present invention relates to multiphase, ultra low k films for use as an intralevel or interlevel dielectric film, a cap material, or a hard mask/polish stop in a ULSI back-end-of-the-line (BEOL) wiring structure, electronic structures containing the films and methods of fabricating such films and structures.

BACKGROUND OF THE INVENTION

The continuous shrinking in dimensions of electronic devices utilized in ULSI (ultra large scale integrated) circuits in recent years has resulted in increasing the resistance of the BEOL metallization as well as increasing the capacitance of the intralayer and interlayer dielectric material. This combined effect, in turn, increases signal delay in ULSI electronic devices. In order to improve the switching performance of future ULSI circuits, low dielectric constant (k) insulators and particularly those with k significantly lower than that of silicon dioxide are needed to reduce the capacitance. Specifically, low k insulators having a k value of less than 4.0 are needed. Unless otherwise noted, all k values mentioned in the present application are measured relative to a vacuum.

Dielectric materials that have low k values have been commercially available; for instance, one such material is polytetrafluoroethylene (PTFE) with a k value of 2.0. However, these dielectric materials are generally not thermally stable when exposed to temperatures above 300° C.~350° C. which renders them useless during integration of these dielectrics in ULSI chips which require a thermal stability of at least 400° C.

Typical prior art low k materials that have been considered for application in ULSI devices include polymers that contain silicon (Si), carbon (C) and oxygen (O), such as methylsiloxane, methylsesquioxanes, and other organic and inorganic polymers. For instances, materials described in a paper "Properties of new low dielectric constant spin-on silicon oxide based dielectrics" by N. Hacker et al., published in Mat. Res. Soc. Symp. Proc., vol. 476 (1997) p25 appear to satisfy the thermal stability requirement, even though some of these materials propagate cracks easily when reaching thicknesses needed for integration in the interconnect structure when films are prepared by a spin-on technique. Furthermore, the precursor materials are high cost and prohibitive for use in mass production. In contrast to this, most of the fabrication steps of VLSI and ULSI chips are carried out by plasma enhanced chemical or physical vapor deposition techniques.

The ability to fabricate a low-k material by a plasma enhanced chemical vapor deposition (PECVD) technique using previously installed and available processing equipment will thus simplify its integration in the manufacturing process, reduce manufacturing cost, and create less hazardous waste. U.S. Pat. Nos. 6,147,009 and 6,497,963 assigned to the common assignee of the present invention, which are incorporated herein by reference in their entirety, describe a low dielectric constant material consisting of Si, C, O and H atoms having a dielectric constant not more than 3.6 and which exhibits very low crack propagation velocities.

U.S. Pat. Nos. 6,312,793, 6,441,491 and 6,479,110 B2, assigned to the common assignee of the present invention and incorporated herein by reference in their entirety, describe a multiphase low k dielectric material that consists of a matrix composed of Si, C, O and H atoms, a phase composed mainly of C and H and having a dielectric constant of not more than 3.2.

Ultra low k films having a dielectric constant of less than 2.7 (and preferably less than 2.3) are also known in the art. A major problem with prior art ultra low k films is that when integrating such films in ULSI devices, the integrated films exhibit poor mechanical strength. Generally, ultra low k films have a much lower elastic modulus and hardness as compared with films with k values of approximately 2.7-3.

In view of the above drawbacks with prior art ultra low k films, there exists a need for developing PECVD processes that can produce ultra low k films that exhibit improved mechanical properties such as improved elastic modulus and hardness.

SUMMARY OF THE INVENTION

It is therefore an object of the present invention to provide an ultra low dielectric constant (k) film having a dielectric constant of not more than 2.7 which also exhibits improved mechanical properties such as improved elastic modulus and hardness.

It is another object of the present invention to provide PECVD methods for fabricating the ultra low k films of the present invention.

It is a further object of the present invention to provide a method for fabricating an ultra low k film that comprises at least two phases, i.e., a multiphase film, wherein the first phase is comprised of Si, C, O and H, i.e., a hydrogenated oxidized silicon carbon, or carbon doped oxide, CDO film (henceforth called SiCOH), and at least a second phase that consists essentially of C and H atoms. The multiphase, ultra low k film of the present invention, which mainly comprises atoms of Si, C, O and H, has a stronger skeleton compared to the multiphase material disclosed in U.S. Pat. Nos. 6,312,793, 6,347,443 and 6,479,110 B2.

It is a further object of the present invention to prepare a multiphase, ultra low k film that contains nanometer-sized pores or voids, which are on the order of about 0.5 to about 20 nm.

It is yet another object of the present invention to prepare a multiphase, ultra low k film which has a dielectric constant of 2.4 or less, an elastic modulus of about 5 or greater and a hardness of about 0.7 or greater, which values are greater than existing ultra low k films.

It is yet another object of the present invention to prepare a multiphase, ultra low k film which has a dielectric constant of 2.2 or less, an elastic modulus of about 3 or greater and a hardness of about 0.3 or greater, which values are greater than existing ultra low k films.

It is still another further object of the present invention to provide methods for fabricating a multiphase, ultra low k film in a parallel plate plasma enhanced chemical vapor deposition reactor.

It is yet another object of the present invention to provide methods for fabricating a multiphase, ultra low k film for use in electronic structures as an intralevel or interlevel dielectric in a BEOL interconnect structure.

It is still another further object of the present invention to provide an electronic structure incorporating layers of insulating materials as intralevel or interlevel dielectrics in a BEOL wiring structure in which at least one of the layers of insulating materials is a multiphase, ultra low k film of the present invention.

It is yet another further object of the present invention to provide an electronic structure which has layers of the inventive multiphase, ultra low k films as intralevel or interlevel dielectrics in a BEOL wiring structure which contains at least one dielectric cap layer formed of different materials for use as a reactive ion etching mask, a polish stop or a diffusion barrier.

These and other objects and advantages are achieved in the present invention by utilizing a method which includes one of the following alternatives: at least one precursor gas comprising siloxane molecules containing at least three Si—O bonds; or at least one precursor gas comprising siloxane molecules containing reactive groups that are sensitive to e-beam radiation.

In accordance with the present invention, a multiphase, ultra low k film comprising atoms of Si, C, O and H is provided. The multiphase, ultra low k film of the present invention has a dielectric constant of about 2.7 or less, and more importantly, the film of the present invention has improved mechanical properties. In particular, the multiphase, ultra low k film of the present invention is characterized as having a dielectric constant of 2.4 or less, an elastic modulus of about 5 or greater and a hardness of about 0.7 or greater. More preferably, the multiphase, ultra low k dielectric film of the present invention has a dielectric constant of 2.2 or less, an elastic modulus of about 3 or greater, and a hardness of from about 0.3 or greater. The elastic modulus and hardness are typically measured by nanoindentation techniques, and these properties generally decrease as the dielectric constant is decreased.

The multiphase, ultra low k film of the present invention may be formed utilizing one of the following three embodiments. In the first embodiment, the multiphase, ultra low k film is prepared by the steps of: providing a plasma enhanced chemical vapor deposition reactor; positioning a substrate in the reactor; flowing a first precursor gas containing atoms of Si, C, O and H into the reactor; flowing a second precursor gas comprising mainly organic molecules containing atoms of C, H, and optionally O, F, and N into the reactor; flowing a precursor gas comprising siloxane molecules containing at least three, preferably four, Si—O bonds into the reactor; and depositing a multiphase, ultra low k film on the substrate. Optionally, the deposited film can be heat treated at a temperature of not less than 300° C. for a time period of at least 0.25 hour. The first embodiment of the present invention may further include the step of providing a parallel plate reactor which has a conductive area of a substrate chuck between about 300 $cm^2$ and about 800 $cm^2$, and a gap between the substrate and a top electrode between about 0.1 cm and about 10 cm. A RF power is applied to at least one of the electrodes. The substrate may be positioned on the powered electrode or on the grounded electrode.

In a second embodiment, the multiphase, ultra low k film can be prepared using a method which includes the steps of: providing a plasma enhanced chemical vapor deposition reactor; positioning a substrate in the reactor; flowing a first precursor gas containing atoms of Si, C, O and H into the reactor; flowing a second precursor gas comprising mainly organic molecules containing atoms of C, H, and optionally F, N and O into the reactor; flowing a precursor gas comprising molecules containing reactive groups that are sensitive to e-beam radiation into the reactor; depositing a multiphase, ultra low k film on the substrate; and curing the deposited film with e-beam radiation. The second embodiment of the present invention may further include the step of providing a parallel plate reactor which has a conductive area of a substrate chuck between about 300 $cm^2$ and about 800 $cm^2$, and a gap between the substrate and a top electrode between about 0.1 cm and about 10 cm. A RF power is applied to at least one of the electrodes. The substrate may be positioned on the powered electrode or on the grounded electrode.

In a third embodiment of the present invention, the multiphase, ultra low k dielectric film is prepared by the steps of providing a plasma enhanced chemical vapor deposition reactor; positioning a substrate in the reactor; flowing a first precursor gas containing atoms of Si, C, O and H into the reactor; flowing a precursor gas comprising molecules containing reactive groups that are sensitive to e-beam radiation into the reactor; depositing a multiphase, ultra low k film on the substrate; and curing the deposited film with e-beam radiation. The third embodiment of the present invention may further include the step of providing a parallel plate reactor which has a conductive area of a substrate chuck between about 300 $cm^2$ and about 800 $cm^2$, and a gap between the substrate and a top electrode between about 0.1 cm and about 10 cm. A RF power is applied to at least one of the electrodes. The substrate may be positioned on the powered electrode or on the grounded electrode.

It is yet another object of the present invention to prepare a multiphase, ultra low k film which has a dielectric constant of 2.4 or less, an elastic modulus of about 5 or greater and a hardness of about 0.7 or greater, which values are greater than existing ultra low k films. The elastic modulus and hardness are expressed in GPa and are measured by nanoidentation techniques well known in the art.

In any of the three embodiments described above, He, $CO_2$ or a mixture of $CO_2$ and $O_2$ may be used in conjunction with one of the precursor gasses or may be added directly to the reactor. In yet another embodiment of the present invention, He or $CO_2$ (or a mixture of He and $CO_2$) may be employed as a carrier gas.

The present invention is further directed to an electronic structure which has layers of insulating materials as intralevel or interlevel dielectrics in a BEOL interconnect structure which includes a pre-processed semiconducting substrate that has a first region of metal embedded in a first layer of insulating material, a first region of conductor embedded in a second layer of insulating material which includes a multiphase, ultra low k material of the present invention, the second layer of insulating material being in intimate contact with the first layer of insulating material, the first region of conductor being in electrical communication with the first region of metal, and a second region of conductor being in electrical communication with the first region of conductor and being embedded in a third layer of insulating material including the inventive multiphase, ultra low k film, the third layer of insulating material being in intimate contact with the second layer of insulating material.

The electronic structure may further include a dielectric cap layer situated in-between the first layer of insulating material and the second layer of insulating material, and may further include a dielectric cap layer situated in-between the second layer of insulating material and the third layer of insulating material. The electronic structure may further include a first dielectric cap layer between the second layer of insulating material and the third layer of insulating material, and a second dielectric cap layer on top of the third layer of insulating material.

The dielectric cap material can be selected from silicon oxide, silicon nitride, silicon oxinitride, silicon carbon nitride (SiCN), refractory metal silicon nitride with the refractory metal being Ta, Zr, Hf or W, silicon carbide, silicon carbo-oxide, carbon doped oxides and their hydrogenated or nitrided compounds. The first and the second dielectric cap layers may be selected from the same group of dielectric materials. The first layer of insulating material may be silicon oxide or silicon nitride or doped varieties of these materials, such as PSG or BPSG. The electronic structure may further include a diffusion barrier layer of a dielectric material deposited on at least one of the second and third layer of insulating material. The electronic structure may further include a dielectric layer on top of the second layer of insulating material for use as a RIE hard mask/polish stop layer and a dielectric diffusion barrier layer on top of the dielectric RIE hard mask/polish-stop layer. The electronic structure may further include a first dielectric RIE hard mask/polish-stop layer on top of the second layer of insulating material, a first dielectric RIE diffusion barrier layer on top of the first dielectric polish-stop layer, a second dielectric RIE hard mask/polish-stop layer on top of the third layer of insulating material, and a second dielectric diffusion barrier layer on top of the second dielectric polish-stop layer. The electronic structure may further include a dielectric cap layer of same materials as mentioned above between an interlevel dielectric of a multiphase material and an intralevel dielectric of an ultra low k film of the present invention.

BRIEF DESCRIPTION OF THE DRAWINGS

These and other objects, features and advantages of the present invention will become apparent from the following detailed description and the appended drawings in which.

DETAILED DESCRIPTION OF THE INVENTION

The present invention discloses a multiphase, ultra low k film that has improved elastic modulus and hardness, and methods for fabricating such films. The films disclosed in the preferred embodiment contain at least two phases, in which the first phase is a "host" matrix of a hydrogenated oxidized silicon carbon material (SiCOH) consisting of Si, C, o and H in a covalently bonded network. The other phases of the multiphase, low k film of the invention consist mainly of C and H atoms. The multiphase, ultra low k film may further contain molecular scale pores or voids, i.e., approximately 0.5 to 20 nanometer in diameter.

Moreover, the multiphase, ultra low k film of the present invention has a dielectric constant of not more than about 2.7, preferably not more than about 2.4, an elastic modulus of about 7 or greater, and a hardness of from about 1.2 or greater. Even more preferably said multiphase, ultra low k film has a dielectric constant of not more than about 2.2, an elastic modulus of about 5 or greater, and a hardness of from about 0.8 or greater. The present invention further discloses various methods for fabricating a multiphase, ultra low k film using a parallel plate plasma enhanced chemical vapor deposition reactor.

Figure 1A:
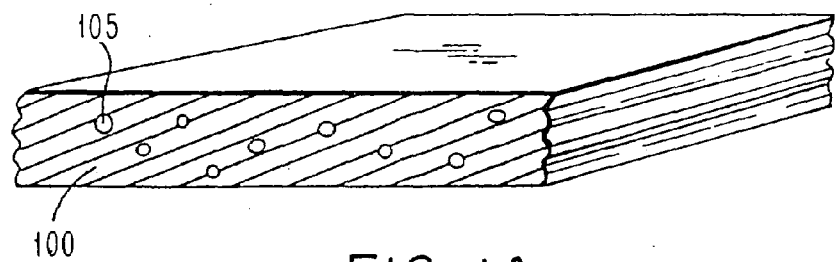
FIG. 1A is an enlarged, cross-sectional view of the present invention dual-phase material.

Referring now to FIG. 1A, a dual-phase material of the present invention is shown in an enlarged, cross-sectional view. The first phase 100 is a "host" matrix which is a hydrogenated oxidized silicon carbon material (SiCOH) including Si, C, O and H in a covalently bonded network and has a dielectric constant of not more than 3.6. The covalently bonded network structure of the first phase is shown in FIG. 1B.

Figure 1B:
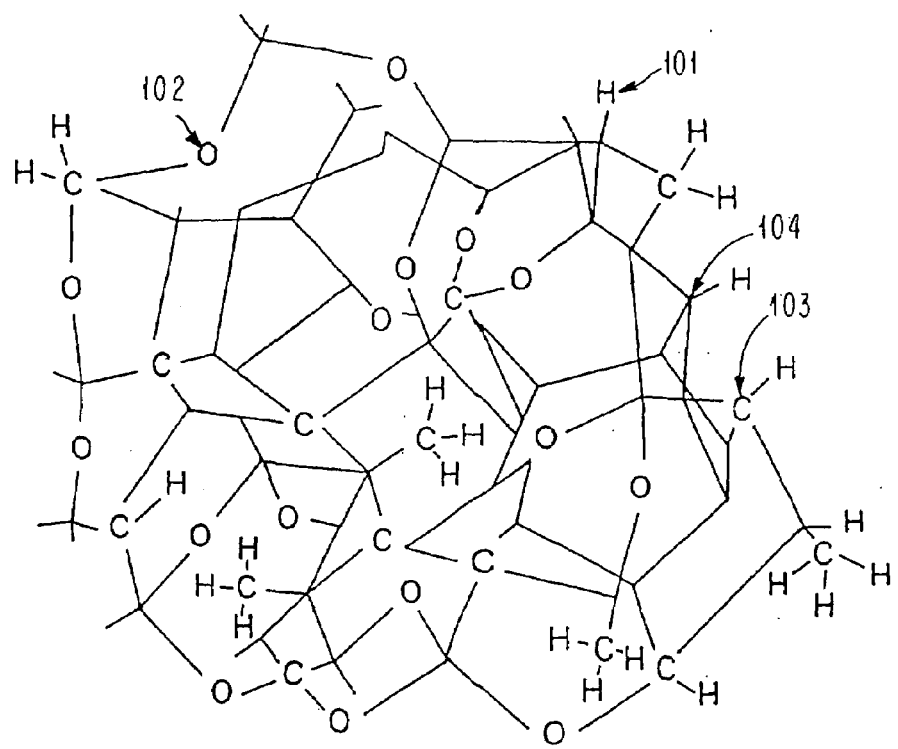
FIG. 1B is a schematic representation of the random covalent structure of the first phase of the present invention dual-phase material.

Referring now to FIG. 1B, the solid lines represent covalent bonds between the Si, C, O and H atoms. This is a random network, so that no fundamental repeating unit exists for the structure. The hydrogen atoms are shown as "H" labeled 101. The oxygen atoms in the network are shown as "O" and are labeled 102. The carbon atoms in the network are represented by "C" and are labeled 103. The silicon atoms in the network arc represented by the intersection of four lines and are labeled 104. The oxygen atoms, 102, lie between 2 atoms of either C or Si.

Located within the first phase is the second phase 105 of the present invention ultra low k material. The second phase consists essentially of C and H atoms. The multiphase material further includes a multiplicity of pores of nanometer size, i.e., from 0.5 to 20 nanometer in diameter. The covalently bonded network structure of the first phase, also called the "host" matrix, is shown in FIG. 1B.

Figure 2:
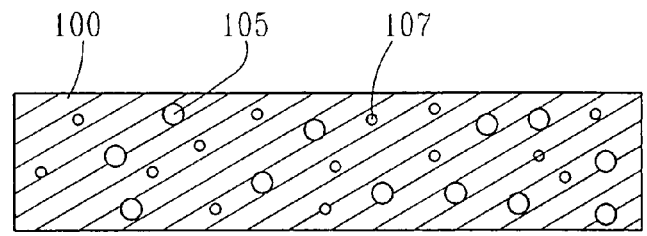
FIG. 2 is an enlarged, cross-sectional view of the present invention tri-phase material.

Referring to FIG. 2, a tri-phase ultra low material of the present invention is shown in an enlarged, cross-sectional view. The first phase 100 is a "host" matrix which is a hydrogenated oxidized silicon carbon material (SiCOH) consisting of Si, C, O and H in a covalently bonded network and having a dielectric constant of not more than 3.6. The structure of the first phase has been shown above in FIG. 1B. Located within the first phase is the second phase 105 of the present invention ultra low k material and the third phase 107 of the present invention ultra low k material. The second phase consists essentially of C and H atoms and a multiplicity of pores of a nanometer size, i.e., from 0.5 to 200 nanometer in diameter.

In an alternative embodiment of the film of this invention, a third phase 107 may be present as open regions (or voids) that may be described as a disruption of the random network (FIG. 1B) of the first phase of the multiphase material of this invention. Alternatively, the third phase consists of C and H atoms, and a multiplicity of pores of a nanometer size. The size of the pores may be larger than the pores in the dual-phase composition. Specifically, the size of the pores in the third phase is from 0.5 to 100 nanometer in diameter.

The multiphase, ultra low k films of the present invention are also characterized as having about 5 to about 40 atomic percent Si; about 5 to about 45 percent C; from 0 to about 50 atomic percent O; and about 10 to about 55 atomic percent H.

More preferably, said films have about 10 to about 20 atomic percent Si; about 20 to about 35 percent C; from 15 to about 35 atomic percent O; and about 20 to about 45 atomic percent H.

In an example film produced according to the invention, the composition is 15 atomic percent Si; 28 percent C; 24 atomic percent O; and 33 atomic percent H, with a density of 1.55±0.02 grams/cm$^3$ as measured using RBS.

As stated above, the multiphase, ultra low k film of the present invention may be formed utilizing three different embodiments. In the first embodiment, the ultra low k film is prepared by the steps of: providing a plasma enhanced chemical vapor deposition reactor, positioning a substrate in the reactor, flowing a first precursor gas, or gas mixture containing atoms of Si, C, O and H into the reactor, flowing a second precursor gas comprising mainly organic molecules containing atoms of C, H, and optionally F, N and O into the reactor, flowing a third precursor gas comprising siloxane molecules containing at least three, preferably four, Si—O bonds into the reactor and depositing an ultra low k film on the substrate.

In the second embodiment, the ultra low k film can be prepared using a method which includes the steps of: providing a plasma enhanced chemical vapor deposition reactor, positioning a substrate in the reactor, flowing a first precursor gas containing atoms of Si, C, O and H into the reactor, flowing a second precursor gas comprising mainly organic molecules containing atoms of C, H, and optionally F, N and O into the reactor, flowing a third precursor gas comprising molecules containing reactive groups that are sensitive to e-beam radiation into the reactor, depositing an ultra low k film on the substrate in the reactor and curing the deposited film with e-beam radiation. The third precursor gas may be a siloxane or a bifunctional organic molecule.

In the third embodiment of the present invention, the ultra low k dielectric film is prepared by the steps of providing a plasma enhanced chemical vapor deposition reactor, positioning a substrate in the reactor, flowing a first precursor gas containing atoms of Si, C, O and H into the reactor, flowing a second precursor gas comprising molecules containing reactive groups that are sensitive to e-beam radiation into the reactor, depositing an ultra low k film on the substrate and curing the deposited film with e-beam radiation. The second precursor gas employed in the third embodiment of the present invention may be a siloxane or a bifunctional organic molecule.

In the three embodiments of the present invention mentioned above, the first precursor utilized may be selected from one or more molecules containing at least atoms of Si, C, O and H. Oxidizing molecules such as $O_2$ or $N_2O$ can be added to the first precursor. Preferably the first precursor is a siloxane containing Si, C, O and H atoms, with cyclic siloxanes being especially preferred. Examples of some highly preferred first precursors include siloxanes selected from molecules with ring structures such as 1,3,5,7-tetramethylcyclotetrasiloxane (TMCTS or $C_4H_{16}O_4Si_4$), octamethylcyclotetrasiloxane (OMCTS, $C_8H_{24}O_4Si_4$), tetraethylcyclotetrasiloxane ($C_8H_{24}O_4Si_4$), decamethylcyclopentasiloxane ($C_{10}H_{30}O_5Si_5$), trimethylcyclotrisiloxane, hexamethylcyclotrisiloxane, molecules of methylsilanes mixed with an oxidizing agent such as $O_2$ or $N_2O$ or precursor mixtures including Si, O and C. The precursor can be delivered directly as a gas to the reactor, delivered as a liquid vaporized directly within the reactor, or transported by an inert carrier gas such as helium or argon. The first precursor gas may further contain elements such as nitrogen, fluorine or germanium.

The second precursor utilized in the first and second embodiments of the present invention may be selected from one or more organic molecules containing C and H atoms. Thus, the present invention contemplates instances where a single second precursor, or a combination of two or more, preferably two different, second precursors are employed. Optionally, O, N or F atoms may be contained in the organic molecules, or organic molecules containing such atoms may be added to the precursor mixture. The precursor can be delivered directly as a gas to the reactor, delivered as a liquid vaporized directly within the reactor, or transported by an inert carrier gas such as helium or argon.

In one embodiment, the second precursor is selected from the group comprising molecules with ring structures containing C and H atoms such as cyclic hydrocarbons, cyclic alcohols, cyclic ethers, cyclic aldehydes, cyclic ketones, cyclic esters, phenols, cyclic amines, or other O, N or F containing cyclic hydrocarbons. More preferably, the second precursor molecule is a multicyclic (or polycyclic) hydrocarbon containing about 6 to 12 carbon atoms, with preferably rings of 3 or more atoms. Preferred examples include 2,5-norbornadiene (also known as bicyclo[2.2.1]hepta-2,5-diene), norbornylene 2,5-norbornadiene (also known as bicyclo [2.2.1]hepta-2,5-diene), norbornane (also known as bicyclo[2.2.1]heptane). Other examples are tricyclo[3.2.1.0]octane, tricyclo[3.2.2.0]nonane, connected ring hydrocarbons such as spiro[3.4]octane, spirol[4.5]nonane, spiro[5.6]decane, and the like. Alternatively, cyclic hydrocarbons containing from 5 to 12 carbon atoms (cyclopentane, cyclohexane, and the like) and also cyclic aromatic hydrocarbons containing 6 to 12 C atoms (benzene, toluene, xylenes, and the like) may be used. Optionally, O or F atoms may be contained in the molecules, or molecules containing such atoms added to the precursor mixture.

Especially useful, are species containing fused rings, at least one of which contains a heteroatom, preferentially oxygen. Of these species, the most suitable are those that include a ring of a size that imparts significant ring strain, namely rings of 3 or 4 atoms and/or 7 or more atoms. Particularly attractive, are members of a class of compounds known as oxabicyclics. Among the readily available examples of these, are 6-oxabicyclo [3.1.0]hexane or cyclopentene oxide (bp=102° C. at 760 mm Hg); 7-oxabicyclo [4.1.0]heptane or cyclohexene oxide (bp=129° C. at 760 mm Hg); 9-oxabicyclo[6.1.0]nonane or cyclooctene oxide (bp=55° C. at 5 mm Hg); and 7-oxabicyclo[2.2.1]heptane or 1,4-epoxycyclohexane (bp=119° C. at 713 mm Hg). One highly preferred fused ring species that is employed in the first embodiment of the present invention is cyclopentene oxide (CPO).

In the first embodiment of the present invention, the method includes a third precursor or a mixture thereof which comprises siloxane molecules containing at least three, preferably 4, Si—O bonds. This precursor employed in the first embodiment of the present invention adds a small concentration (on the order of from about 0.1 to about 10% based on the total precursor flow) of tetrahedral Si—O bonding to the resultant multiphase, ultra low k film. The third precursor employed in the first embodiment of the present invention may include a siloxane selected from tetramethylorthosilicate (TMOS), tetraethylorthosilicate (TEOS), vinyltriethoxysilane, allyltrimethoxysilane, vinyltrimethoxysilane, allyltriethoxysilane, phenyltriethoxysilane, and phenyltrimethoxysilane. This group of precursors also includes siloxanes containing 2 unsaturated groups such as, for example, divinyldimethoxysilane. The precursor can be delivered directly as a gas to the reactor, delivered as a liquid vaporized directly within the reactor, or transported by an inert carrier gas such as helium or argon.

The second and third embodiments of the present invention recite the use of a precursor gas or a mixture thereof comprising molecules that contain reactive groups that are sensitive to e-beam radiation, typically these are unsaturated hydrocarbon groups containing at least 1 C—C double, triple bond or an unsaturated ring. The precursor may be a siloxane containing an unsaturated hydrocarbon group, or it may be a bifunctional organic molecule. Examples of reactive groups that are sensitive to e-beam radiation include, but are not limited to: vinyl, allyl, phenyl, acetylenic groups, and mixtures thereof. Illustrative examples of precursor gases comprising siloxane molecules that contain e-beam sensitive reactive groups include: vinyltrimethoxysilane, allyltrieoxysilane, allyltrimethoxysilane, phenyltriethoxysilane, phenyltrimethoxysilane, and related siloxanes containing unsaturated hydrocarbon groups, including but not limited to vinyl, allyl, phenyl, and acetylenic groups. Illustrative examples of precursor gases comprising bifunctional organic molecules that contain e-beam sensitive reactive groups include straight chain unsaturated molecules such as 1,3-butadiene, 1,4-pentadiene, 1,5-hexadiene, and also monocyclic bifunctional molecules such as cyclooctadiene, bicyclic bifunctional molecules such as bicyclo [2.2.1] hepta-2,5-diene (or "norbornadiene") and related organic molecules containing more than one unsaturated C—C double or triple bond.

The precursor can be delivered directly as a gas to the reactor, delivered as a liquid vaporized directly within the reactor, or transported by an inert carrier gas such as helium or argon.

Figure 3:
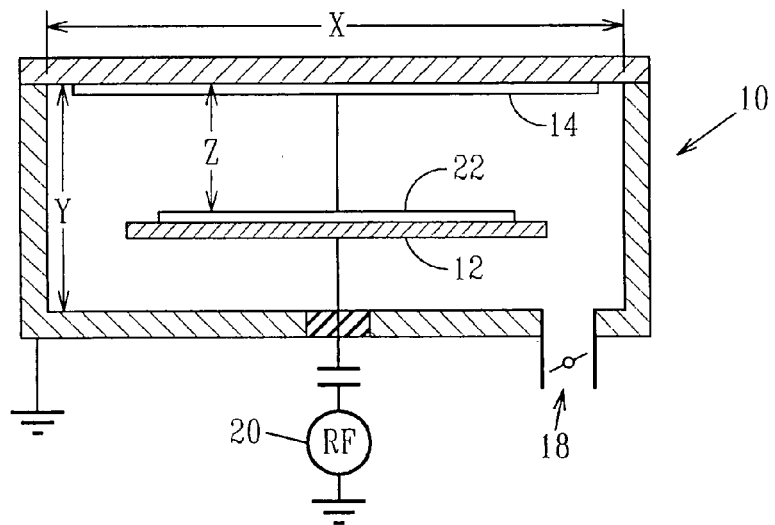
FIG. 3 is a cross-sectional view of the present invention parallel plate chemical vapor deposition reactor.

The methods of the present invention each include the use of a plasma enhanced chemical vapor deposition (PECVD) reactor. The deposition made be performed in a continuous mode or in a pulsed mode. Preferably, the PECVD reactor employed in the present invention is a parallel plate type reactor. FIG. 3 provides a simplified view of a parallel plate PECVD reactor 10 for processing 200 mm wafers that may be employed in the present invention. The gas precursors are introduced into reactor 10 through the gas distribution plate (GDP) 14, which is separated from the substrate chuck 12 by a gap and are pumped out through a pumping port 18. The RF power 20 is connected to the substrate chuck 12 and transmitted to the substrate 22. For practical purposes, all other parts of the reactor are grounded. The substrate 22 thus acquires a negative bias, whose value is dependent on the reactor geometry and plasma parameters. In a different embodiment, the RF power 20 can be connected to the GDP 14, which is electrically insulated from the reactor, and the substrate chuck 12 is grounded. In another embodiment, more than one electrical power supply can be used. For instance, two power supplies can operate at the same RF frequency, or one may operate at a low frequency and one at a high frequency. The two power supplies may be connected both to the same electrode or to separate electrodes. In another embodiment, the RF power supply can be pulsed on and off during deposition. Process variables controlled during deposition of the low-k films are RF power, precursor mixture and flow rate, pressure in reactor, and substrate temperature.

In FIG. 3, X represents the distance between sidewalls of the reactor, Y represents the distance between the top and bottom walls of the reactor, and Z represents the distance between the top wall of the reactor and the top surface of substrate 22.

The main process variables controlled during a deposition process for a film are the RF power, the flow rates of the precursors, the reactor pressure and the substrate temperature. It should be emphasized that the fabricating method according to the present invention is only possible by utilizing a deposition reactor that has a specific geometry with uniquely defined growth conditions. When a reactor of different geometry is used under the defined growth conditions, the films produced may not achieve the ultra low dielectric constant.

For instance, the parallel plate reactor according to the present invention should have an area of the substrate chuck of between about 300 $cm^2$ and about 800 $cm^2$, and preferably between about 500 $cm^2$ and about 600 $cm^2$. The gap between the substrate and the gas distribution plate (or top electrode) is between about 0.1 cm and about 10 cm, and preferably between about 1.5 cm and about 7 cm. A RF power is applied to one of the electrodes at a frequency between about 12 MHZ and about 15 MHZ, and preferably at about 13.56 MHZ. A low frequency, below 1 MHz, power can optionally be applied at the same electrode as the RF power, or to the opposite electrode at a power density of 0 to 1.5 $W/cm^2$.

The deposition conditions utilized are also critical to enable a successful implementation of the deposition process according to the present invention. For instance, a wafer temperature of between about 25° C. and about 325° C., and preferably of between about 60° C. and about 200° C. is utilized. A RF power density between about 0.05 $W/cm^2$ and about 4.0 $W/cm^2$, and preferably between about 0.25 $W/cm^2$ and about 4 $W/cm^2$ is utilized.

In the first embodiment of the present invention, a reactant gas flow rate of the first precursor gas, e.g., TMCTS, between about 5 sccm and about 1000 sccm, and preferably between about 25 sccm and about 200 sccm is utilized. The reactant gas flow rate of the second precursor gas, e.g., CPO, between about 5 sccm and about 50,000 sccm, and preferably between about 25 sccm and about 10,000 sccm is utilized. The gas flow rate of the third precursor gas, i.e., siloxane molecules containing at least three Si—O bonds, employed in the first embodiment of the present invention is between about 5 sccm to about 1000 sccm, with a flow rate between 10 sccm to about 500 sccm of the third precursor gas being more highly preferred.

In the second embodiment of the present invention, a reactant gas flow rate of the first precursor gas, e.g., TMCTS, between about 5 sccm and about 1000 sccm, and preferably between about 25 sccm and about 200 sccm is utilized. The reactant gas flow rate of the second precursor gas, e.g., CPO, between about 5 sccm and about 50,000 sccm, and preferably between about 25 sccm and about 10,000 sccm is utilized. The gas flow rate of the third precursor gas, i.e., molecules containing reactive groups that are sensitive to e-beam radiation, employed in the second embodiment of the present invention is between about 5 sccm to about 1000 sccm, with a flow rate between 10 sccm to about 500 sccm being more highly preferred.

In the third embodiment of the present invention, a reactant gas flow rate of the first precursor gas, e.g., TMCTS, between about 5 sccm and about 1000 sccm, and preferably between about 25 sccm and about 200 sccm is utilized. The reactant gas flow rate of the second precursor gas, i.e., molecules containing reactive groups that are sensitive to e-beam radiation, employed in the third embodiment of the present invention is between about 5 sccm to about 1000 sccm, with a flow rate between 10 sccm to about 500 sccm being more highly preferred.

In some embodiments of the present invention, He is added to the above-mentioned mixtures at a flow rate between about 50 sccm and 5000 sccm. He may be added to any of the gas precursors and be used as a carrier gas or He can be introduced separately to the PECVD reactor.

A total reactant gas flow rate of gas precursors in each of the three embodiments where He is used as a carrier gas is from about 25 sccm to about 10,000 sccm. A total reactant gas flow rate of gas precursors in each of the three embodiments where He is used as a carrier gas is preferably from about 50 sccm to 5000 sccm.

Furthermore, the first precursor utilized in each of the third embodiments may further be mixed with $CO_2$ as a carrier gas or the first and second precursor gases may be mixed with $CO_2$ or a mixture of $CO_2$ and $O_2$ in the PECVD reactor. The addition of $CO_2$ to the first precursor as a carrier gas, or the addition of $CO_2$ or a mixture of $CO_2$ and $O_2$ to the first and second precursors in the PECVD reactor provides a stabilizing effect on plasma in the PECVD reactor and improves the uniformity of the film deposited on the substrate. When $CO_2$ is admixed with the first and second precursors, the amount of $CO_2$ may be from about 25 sccm to about 1000 sccm, and more preferably from about 50 sccm to about 500 sccm. When a mixture of $CO_2$ and $O_2$ is admixed with the first and second precursors, the amount of $CO_2$ admixed may be from about 25 sccm to about 1000 sccm and the amount of $O_2$ admixed may be from about 0.5 sccm to 50 sccm. More preferably, the amount of $CO_2$ is from about 50 sccm to about 500 sccm and the amount of $O_2$ is from about 1 sccm to about 30 sccm. Alternatively, a mixture of He and $CO_2$ or He alone may be substituted in place of $CO_2$ in the above embodiments.

Reactor pressure during the deposition process between about 50 mTorr and about 5000 mTorr, and preferably between about 100 mTorr and about 3000 mTorr is utilized.

It should be noted that a change in the area of the substrate chuck by a factor, X, i.e., a change from a value in the range between about 300 $cm^2$ and about 800 $cm^2$, will change the RF power by a factor, X, from that previously specified. Similarly, a change in the area of the substrate chuck by a factor, Y, and a change in the gap between the gas distribution plate and the substrate chuck by a factor, Z, from that previously specified, will be associated with a change by a factor, YZ, in the gas flow rates from that previously specified. If a multistation deposition reactor is used, the area of the substrate refers to each individual substrate chuck and the flow rates of the gases refer to one individual deposition station. Accordingly, total flow rates and total power input to the reactor are multiplied by a total number of deposition stations inside the reactor.

In each of the three embodiments, the deposited films may be optionally stabilized before undergoing further integration processing. The stabilization process can be performed by annealing at a temperature of not less than 300° C. for a time period of at least 0.25 hour. More preferably, the annealing is performed in a furnace-annealing step at about 300° C. to about 450° C. for a time period between about 0.5 hours and about 4 hours. The stabilization process can also be performed in a rapid thermal annealing process at temperatures above about 300° C. The thermal stability of the films obtained according to the present invention in a non-oxidizing ambient is up to a temperature of not less than 400° C. It is noted that this step of the present invention serves to further reduce the dielectric constant of the multiphase, ultra low k dielectric film of the present invention. During the heat treatment step, molecular fragments derived from the organic precursors comprising C and H and optionally O atoms may thermally decompose and may be converted into smaller molecules which are released from the film. Optionally, further developments of voids may occur in the film by process of conversion and release of the molecular fragments. The film density is thus decreased.

In an even more highly preferred embodiment of the present invention, annealing is performed utilizing two heating steps. In the first heating step, the film is heated at a temperature not higher than about 300° C. for a first time period, and thereafter, in a second heating step, the film is heated to a temperature not lower than about 300° C. for a second period of time, where the second period of time is longer than the first period of time. Preferably, the second time period is at least ten times longer than the first time period.

In each of the three embodiments of the present, but especially with the second and third embodiments of the present invention, a curing step follows the deposition of the multiphase, ultra low k film. Preferably, curing is performed using e-beam radiation for a time period of from about 0.5 to about 100 minutes at a temperature of from about 350° C. to about 450° C. Example conditions are the use of e-beam energy between about 1 and 100 keV, and a dose of electron radiation equal to between about 50 and about 5000 microCurie/$cm^2$. Preferred conditions use e-beam energy between about 2 and 30 keV, and a dose of electron radiation equal to between about 100 and about 2000 microCurie/$cm^2$. In some embodiments, e-beam curing is performed under vacuum. Within the second and third embodiments of the present invention, the e-beam curing step following the deposition of the multiphase, ultra low k film is applied to form a more dense region at the top surface of the film, and this is done by adjusting the e-beam radiation conditions. The dense region may be useful as a CMP stop region formed within the top of the ultra low k film.

The multiphase, ultra low k films obtained by the present invention process are characterized by dielectric constants of k<2.7, and are thermally stable for process integration in a BEOL interconnect structure which is normally processed at temperatures of up to 450° C. Furthermore, the multiphase, ultra low k films have extremely low crack propagation velocities in water, i.e., below $10^{-9}$ m/s and may even be below $10^{-11}$ m/s. The multiphase films and methods can therefore be easily adapted in producing multiphase, ultra low k films as intralevel and interlevel dielectrics in BEOL processes for logic and memory devices. The multiphase, ultra low k films of the present invention are also characterized by having improved mechanical properties including the improved elastic modulus and hardness mentioned above.

The electronic devices formed by the present invention novel method are shown in FIGS. 4-7. It should be noted that the devices shown in FIGS. 4-7 are merely illustrative examples of the present invention, while an infinite number of other devices may also be formed by the present invention novel methods.

In some embodiments of the present invention, a dense region at the top surface of the inventive film can be formed by adjusting the e-beam radiation conditions. The dense region of such a film is useful a CMP etch step. This film having the densified top surface may be used in any of the electronic devices described herein.

Figure 4:
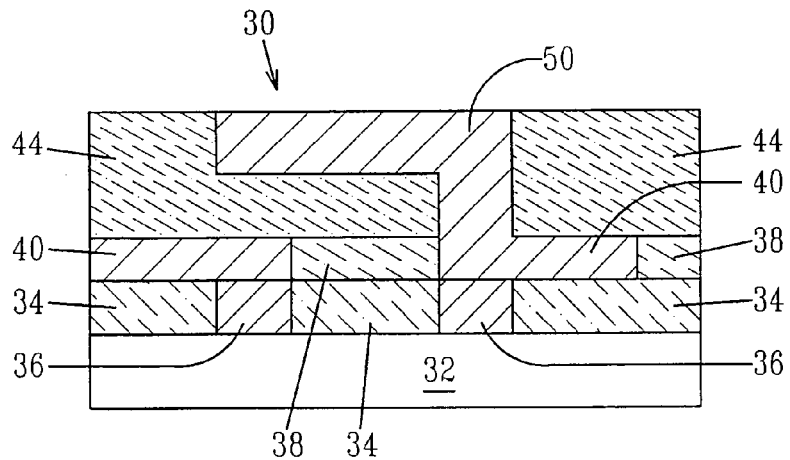
FIG. 4 is an enlarged, cross-sectional view of a present invention electronic device having an intralevel dielectric layer and an interlevel dielectric layer formed of the multiphase, ultra low k film.

In FIG. 4, an electronic device 30 built on a silicon substrate 32 is shown. On top of the silicon substrate 32, an insulating material layer 34 is first formed with a first region of metal 36 embedded therein. After a CMP process is conducted on the first region of metal 36, a multiphase, ultra low k film 38 of the present invention is deposited on top of the first layer of insulating material 34 and the first region of metal 36. The first layer of insulating material 34 may be suitably formed of silicon oxide, silicon nitride, doped varieties of these materials, or any other suitable insulating materials. The multiphase, ultra low k film 38 is then patterned in a photolithography process followed by etching and a conductor layer 40 is deposited thereon. After a CMP process on the first conductor layer 40 is carried out, a second layer of multiphase, ultra low k film 44 is deposited by a plasma enhanced chemical vapor deposition process overlying the first multiphase, ultra low k film 38 and the first conductor layer 40. The conductor layer 40 may be deposited of a metallic material or a nonmetallic conductive material. For instance, a metallic material of aluminum or copper, or a nonmetallic material of nitride or polysilicon. The first conductor 40 is in electrical communication with the first region of metal 36.

A second region of conductor 50 is then formed after a photolithographic process on the second multiphase, ultra low k film layer 44 is conducted followed by etching and then a deposition process for the second conductor material. The second region of conductor 50 may also be deposited of either a metallic material or a nonmetallic material, similar to that used in depositing the first conductor layer 40. The second region of conductor 50 is in electrical communication with the first region of conductor 40 and is embedded in the second layer of multiphase, ultra low k insulator 44. The second layer of multiphase, ultra low k film is in intimate contact with the first layer of insulating material 38. In this example, the first layer of insulating material 38 of multiphase, ultra low k film is an intralevel dielectric material, while the second layer of insulating material, i.e., the multiphase, ultra low k film 44 is both an intralevel and an interlevel dielectric. Based on the low dielectric constant of the multiphase, ultra low k film, superior insulating property can be achieved by the first insulating layer 38 and the second insulating layer 44.

Figure 5:
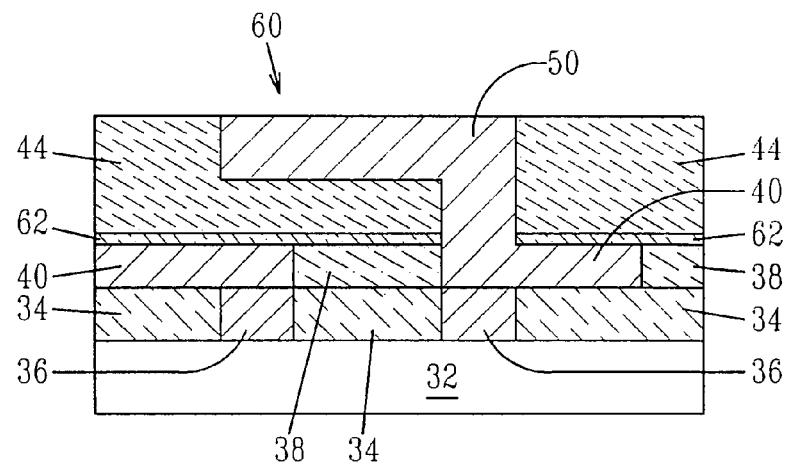
FIG. 5 is an enlarged, cross-sectional view of the present invention electronic structure of FIG. 4 having an additional diffusion barrier dielectric cap layer deposited on top of the multiphase, ultra low k film of the present invention.

FIG. 5 shows a present invention electronic device 60 similar to that of electronic device 30 shown in FIG. 4, but with an additional dielectric cap layer 62 deposited between the first insulating material layer 38 and the second insulating material layer 44. The dielectric cap layer 62 can be suitably formed of a material such as silicon oxide, silicon nitride, silicon oxinitride, refractory metal silicon nitride with the refractory metal being Ta, Zr, Hf or W, silicon carbide, silicon carbo-nitride (SiCN), silicon carbo-oxide (SiCO), and their hydrogenated compounds. The additional dielectric cap layer 62 functions as a diffusion barrier layer for preventing diffusion of the first conductor layer 40 into the second insulating material layer 44 or into the lower layers, especially into layers 34 and 32.

Figure 6:
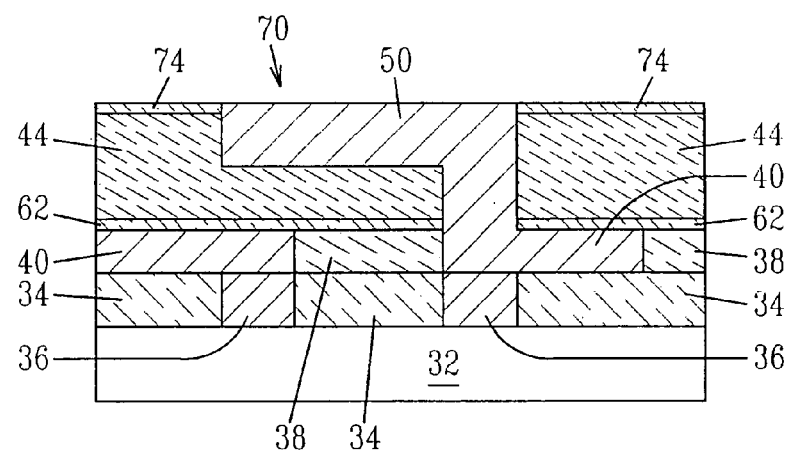
FIG. 6 is an enlarged, cross-sectional view of the present invention electronic structure of FIG. 5 having an additional RIE hard mask/polish stop dielectric cap layer and a dielectric cap diffusion barrier layer deposited on top of the polish-stop layer.

Another alternate embodiment of the present invention electronic device 70 is shown in FIG. 6. In the electronic device 70, two additional dielectric cap layers 72 and 74 which act as a RIE mask and CMP (chemical mechanical polishing) polish stop layer are used.

The first dielectric cap layer 72 is deposited on top of the first multiphase, ultra low k insulating material layer 38 and used as a RIE mask and CMP stop, so the first conductor layer 40 and layer 72 are approximately co-planar after CMP. The function of the second dielectric layer 74 is similar to layer 72, however layer 74 is utilized in planarizing the second conductor layer 50. The polish stop layer 74 can be deposited of a suitable dielectric material such as silicon oxide, silicon nitride, silicon oxinitride, refractory metal silicon nitride with the refractory metal being Ta, Zr, Hf or W, silicon carbide, silicon carbo-oxide (SiCO), and their hydrogenated compounds. A preferred polish stop layer composition is SiCH or SiCOH for layers 72 or 74. A second dielectric layer 74 can be added on top of the second multiphase, ultra low k insulating material layer 44 for the same purposes.

Figure 7:
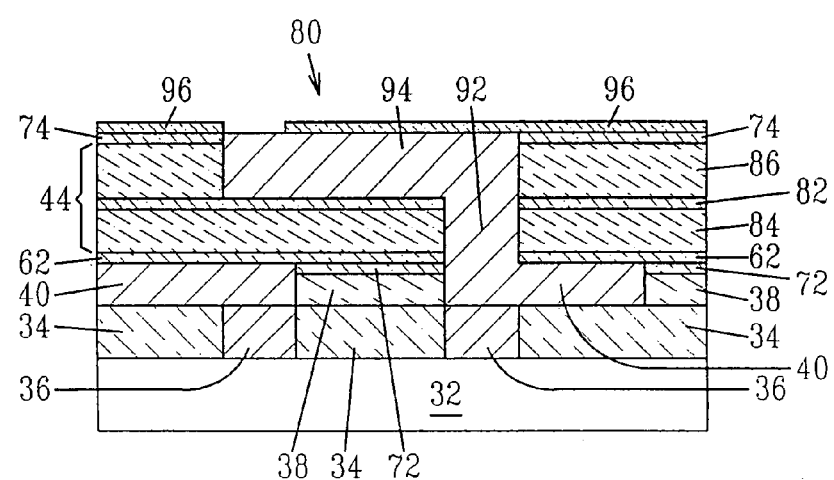
FIG. 7 is an enlarged, cross-sectional view of the present invention electronic structure of FIG. 6 having additional RIE hard mask/polish stop dielectric layers deposited on top of the multiphase, ultra low k film.

Still another alternate embodiment of the present invention electronic device 80 is shown in FIG. 7. In this alternate embodiment, an additional layer 82 of dielectric material is deposited and thus dividing the second insulating material layer 44 into two separate layers 84 and 86. The intralevel and interlevel dielectric layer 44 formed of a multiphase, ultra low k material, shown in FIG. 4, is therefore divided into an interlayer dielectric layer 84 and an intralevel dielectric layer 86 at the boundary between via 92 and interconnect 94. An additional diffusion barrier layer 96 is further deposited on top of the upper dielectric layer 74. The additional benefit provided by this alternate embodiment electronic structure 80 is that dielectric layer 82 acts as an RIE etch stop providing superior interconnect depth control. Thus, the composition of layer 82 is selected to provide etch selectivity with respect to layer 86.

Still other alternate embodiments may include an electronic structure which has layers of insulating material as intralevel or interlevel dielectrics in a wiring structure that includes a pre-processed semiconducting substrate which has a first region of metal embedded in a first layer of insulating material, a first region of conductor embedded in a second layer of the insulating material wherein the second layer of insulating material is in intimate contact with the first layer of insulating material, and the first region of conductor is in electrical communication with the first region of metal, a second region of conductor in electrical communication with the first region of conductor and is embedded in a third layer of insulating material, wherein the third layer of insulating material is in intimate contact with the second layer of insulating material, a first dielectric cap layer between the second layer of insulating material and the third layer of insulating material and a second dielectric cap layer on top of the third layer of insulating material, wherein the first and the second dielectric cap layers are formed of a material that includes atoms of Si, C, O and H, or preferably a multiphase, ultra low k film of the present invention.

Still other alternate embodiments of the present invention include an electronic structure which has layers of insulating material as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor that is in electrical communication with the first region of conductor and is embedded in a third layer of insulating material, the third layer of insulating material is in intimate contact with the second layer of insulating material, and a diffusion barrier layer formed of the multiphase, ultra low k film of the present invention deposited on at least one of the second and third layers of insulating material.

Still other alternate embodiments include an electronic structure which has layers of insulating material as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor in electrical communication with the first region of conductor and is embedded in a third layer of insulating material, the third layer of insulating material is in intimate contact with the second layer of insulating material, a reactive ion etching (RIE) hard mask/polish stop layer on top of the second 7layer of insulating material, and a diffusion barrier layer on top of the RIE hard mask/polish stop layer, wherein the RIE hard mask/polish stop layer and the diffusion barrier layer are formed of the multiphase, ultra low k film of the present invention.

Still other alternate embodiments include an electronic structure which has layers of insulating materials as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor in electrical communication with the first region of conductor and is embedded in a third layer of insulating material, the third layer of insulating material is in intimate contact with the second layer of insulating material, a first RIE hard mask, polish stop layer on top of the second layer of insulating material, a first diffusion barrier layer on top of the first RIE hard mask/polish stop layer, a second RIE hard mask/polish stop layer on top of the third layer of insulating material, and a second diffusion barrier layer on top of the second RIE hard mask/polish stop layer, wherein the RIE hard mask/polish stop layers and the diffusion barrier layers are formed of the multiphase, ultra low k film of the present invention.

Still other alternate embodiments of the present invention includes an electronic structure that has layers of insulating material as intralevel or interlevel dielectrics in a wiring structure similar to that described immediately above but further includes a dielectric cap layer which is formed of a multiphase material including atoms of Si, C, O and H situated between an interlevel dielectric layer and an intralevel dielectric layer.

The present invention novel method and the electronic structures formed by such method have therefore been amply described in the above descriptions and in the appended drawings of FIGS. 1-7. It should be emphasized that the examples of the present invention electronic structures shown in FIGS. 4-7 are merely used as illustrations for the present invention novel methods which, obviously, can be applied in the fabrication of an infinite number of electronic devices.

While the present invention has been described in an illustrative manner, it should be understood that the terminology used is intended to be in a nature of words of description rather than of limitation.

Furthermore, while the present invention has been described in terms of a preferred and several alternate embodiments, it is to be appreciated that those skilled in the art will readily apply these teachings to other possible variations of the inventions.

What we claim is:

1. A method of forming a multiphase, ultra low dielectric constant film comprising:
    positioning a substrate in a plasma enhanced chemical vapor deposition (PECVD) reactor;
    flowing a cyclic siloxane first precursor gas into the reactor;
    flowing a second precursor gas comprising organic molecules containing mainly atoms of C and H into the reactor;
    flowing a third precursor gas into the reactor, said third precursor gas selected from the group consisting of tetramethylorthosilicate (TMOS), tetraethylorthosilicate (TEOS), vinyltriethoxysilane, allyltrimethoxysilane, vinyltrimethoxysilane, allyltriethoxysilane, phenyltriethoxysilane and phenyltrimethoxysilane; and
    depositing a multiphase, ultra low k film having a dielectric constant of about 2.7 or less, said multiphase, ultra low k film containing tetrahedral Si—O bonding and a first phase of hydrogenated oxidized silicon carbon material consisting of Si, C, O and H atoms in a covalently bonded network structure and at least another phase consisting essentially of C and H atoms.

2. The method of claim 1 further comprising adding He to at least one of said precursor gases.

3. The method of claim 1 further comprising adding $CO_2$ to at least one of said first and second precursor gases or a mixture of $CO_2$ and $O_2$ to the second precursor gas.

4. The method of claim 1 wherein said cyclic siloxane is selected from the group consisting of tetramethylcyclotetrasiloxane, decamethylcyclopentasiloxane, octamethylcyclotetrasiloxane, trimethylcyclotrisiloxane and hexamethylcyclotrisiloxane.

5. The method of claim 1 wherein said first precursor gas is tetramethylcyclotetrasiloxane or octamethylcyclotetrasiloxane.

6. The method of claim 1 wherein said second precursor gas comprises species of fused rings that impart significant ring strain, wherein said fused rings include rings of 4, 5, 7 or more atoms.

7. The method of claim 1 wherein said second precursor gas comprises cyclopentene oxide.

8. The method of claim 1 further comprising heat treating said multiphase, ultra low k film after deposition.

9. The method of claim 8 wherein said heat treating is an annealing step performed at a temperature of not less than 300° C. for a time period of at least 0.25 hours.

10. The method of claim 8 wherein said heating treating is performed in two steps, wherein in a first step the film is heated to a temperature of less than 300° C. for a first time period, and in a second step, the film is heated to a temperature of greater than 300° C. for a second time period, said second time period is longer than the first time period.

11. The method of claim 1 further comprising e-beam curing said multiphase, ultra low k film, said e-beam curing is performed at a temperature of from about 350° C. to about 450° C. for a time period of from about 1 minute to about 300 minutes.

12. The method of claim 1 wherein said PECVD reactor is a parallel plate reactor.

13. The method of claim 12 wherein said parallel plate reactor has an area of a substrate chuck between about 300 cm$^2$ and about 800 cm$^2$, and a gap between the substrate and a top electrode between about 1 cm and about 10 cm.

14. The method of claim 12 further comprising the step of applying a RF power to an electrode of said parallel plate reactor.

15. The method of claim 1 wherein said depositing further comprises the steps of: setting a temperature for said substrate at between about 25° C. and about 400° C.; and setting a RF power density from 0.05 to 4.0 W/cm$^2$.

16. The method of claim 1 wherein said depositing further comprises the step of setting flow rates for said first precursor gas at between about 5 sccm and about 1000 sccm.

17. The method of claim 1 wherein said depositing further comprises the step of setting flow rates of said second precursor gas at between about 5 and about 50,000 sccm.

18. The method of claim 1 wherein said depositing further comprises the step of setting flow rate of said third precursor gas at between about 5 sccm and about 1000 sccm.

19. The method of claim 1 wherein said depositing further comprises the step of setting a pressure for said PECVD reactor at between about 50 mTorr and about 5000 mTorr.

20. The method of claim 1 wherein said first precursor gas is tetramethylcyclotetrasiloxane and said second precursor gas is cyclopentene oxide.

* * * * *